United States Patent [19]

Sato et al.

[11] Patent Number: 5,073,001

[45] Date of Patent: Dec. 17, 1991

[54] PHOTOINTERRUPTOR FOR USE IN OPTICAL TRANSMISSION-TYPE ROTARY ENCODER

[75] Inventors: Seiichi Sato; Yoshi Kurosawa; Kazuo Yamaguchi, all of Tokyo; Atsushi Ueda; Masami Matsumura, both of Hyogo, all of Japan

[73] Assignees: Optec D.D. Melco Laboratory Co., Ltd.; Optec Dai-Ichi Denko Co., Ltd.; Mitsubishi Denki Kabushiki Kaisha, all of Tokyo, Japan

[21] Appl. No.: 603,403

[22] Filed: Oct. 26, 1990

[30] Foreign Application Priority Data

Oct. 26, 1989 [JP] Japan ................. 1-125356[U]

[51] Int. Cl.⁵ ............................................. G02B 6/26
[52] U.S. Cl. .................................... 385/19; 385/15
[58] Field of Search ............... 350/96.15, 96.10, 96.16, 350/96.12

[56] References Cited

U.S. PATENT DOCUMENTS

| 4,861,128 | 8/1989 | Ishikawa et al. | 350/96.12 X |
| 4,897,671 | 1/1991 | Mahapaha et al. | 350/96.12 X |
| 4,953,933 | 9/1990 | Asmar | 350/96.15 |
| 5,015,056 | 5/1991 | Yamaguchi et al. | 350/96.15 |

Primary Examiner—Frank Gonzalez
Assistant Examiner—Phan T. Heartney
Attorney, Agent, or Firm—Cushman, Darby & Cushman

[57] ABSTRACT

A photointerruptor for use in an optical transmission-type rotary encoder comprising a rotatable pulse scale having a code pattern and a light-emitting optical fiber and a light-receiving optical fiber secured to a housing with their end faces being opposed to each other on both sides of the code pattern. The housing has a housing main body a pair of optical fiber opposing members for previously inserting the top ends of the respective optical fibers and a housing main body having fitting recesses for holding the optical fiber opposing members with the end faces of the optical fibers being opposed to each other at a predetermined distance on both sides of the code pattern. The housing main body may be constituted by a pair of optical fiber opposing members engageable with each other.

6 Claims, 3 Drawing Sheets

PHOTOINTERRUPTOR FOR USE IN OPTICAL TRANSMISSION-TYPE ROTARY ENCODER

BACKGROUND OF THE INVENTION

1. Field of the Invention

The present invention concerns a photointerruptor for use in an optical transmission-type rotary encoder comprising a rotatable pulse scale having a code pattern formed thereon and a light emitting optical fiber and a light receiving optical fiber which are secured to a housing with the end faces of them being opposed to each other on both sides of the code pattern.

2. Description of the Prior Art

A photointerruptor for use in an optical transmission-type rotary encoder in the prior art comprises a structure, for example, as shown in FIG. 4, in which a housing H is made of a synthetic resin and provided with a pulse scale passing groove or slit 2 for allowing a pulse scale 1 having a code pattern C to rotatably pass through the groove. Mounting apertures 41 and 42 are perforated from both surfaces to the side wall of the groove 2 and a light-emitting optical fiber 3 and a light-receiving optical fiber 4 are inserted through the mounting apertures 41 and 42 such that their end faces 3a and 4a are opposed to each other on both sides of the code pattern C of the pulse scale 1.

Then, the photointerruptor is situated to a predetermined position, such that the end faces 3a and 4a of the respective optical fibers 3 and 4 are opposed to each other on both sides of the code pattern C formed in the pulse scale 1.

In the optical transmission-type rotary encoder described above, since the optical path between the light-emitting optical fiber 3 and the light-receiving optical fiber 4 is formed and shut intermittently by the code pattern C formed on a rotating pulse scale 1, predetermined pulse signals are outputted in accordance with the angle of rotation of the pulse scale. In the photointerruptor, if the end faces 3a and 4a of the light-emitting optical fiber 3 and the light-receiving optical fiber 4 attached to the interruptor are injured or contaminated, the optical pulses outputted in accordance with the angle of rotation can no more be detected accurately.

In the prior art, the end faces 3a and 4a of the light-emitting optical fiber 3 and the light-receiving optical fiber 4 are at first fixed, for example, by means of adhesives being protruded slightly to the inside of the groove 2 and then the end faces are polished by passing an abrasive-coated paper or cloth through the passing groove 2. Alternatively, light-emitting optical fiber 3 and light-receiving optical fiber 4 are previously polished and then inserted into and bonded to the mounting apertures 41 and 42 of the housing H.

However, the polishing operation for the end faces of the optical fibers 3 and 4, while putting them at the inside of the pulse scale passing groove 2, has been difficult, since the gap of the groove 2 is usually as narrow as only about 1.5 mm. In addition, it is also difficult to judge whether the polishing has been conducted satisfactorily or not by confirming the state at the end faces.

In a case of using previously polished optical fibers, since the end faces may be scratched or contaminated with adhesives during the fiber-mounting operation, it is necessary to confirm the state of the end faces after the completion of the mounting operation. However, since the gap of the pulse scale passing groove 2 is narrow, it is difficult to visually observe the state of the end faces and it has been actually difficult to confirm whether the end faces are injured or contaminated.

Accordingly, the polishing operation inevitably requires too much time and labor and this increases the production cost. In addition, even when the polishing has been conducted at the expense of such long time and much labor, since the finishing state can not be confirmed, it is difficult to keep the quality of the optical transmission-type rotary encoder always at a predetermined level.

SUMMARY OF THE INVENTION

It is, accordingly, an object of the present invention to provide a photointerruptor for use in an optical transmission-type rotary encoder capable of easy and satisfactory polishing operation while observing the state at the end faces of optical fibers upon assembling, thereby enabling one to shorten the time required for polishing the optical fibers and reduce the production cost, as well as enabling one to conduct the assembling operation with neither injury nor contamination to the end faces of the optical fibers.

The foregoing object of the present invention can be attained by a photointerruptor for use in an optical transmission-type rotary encoder comprising a rotatable pulse scale having a code pattern formed therein and a light-emitting optical fiber and a light-receiving optical fiber secured to a housing with their end faces being opposed to each other on both sides of the code pattern, wherein the housing comprises a housing main body and a pair of optical fiber opposing members each for previously inserting the top end of each of the light-emitting optical fiber and the light-receiving optical fiber, the housing main body having fitting means formed therein for retaining each of the optical fiber opposing members respectively such that the end faces of the light-emitting optical fiber and the light-receiving optical fiber are opposed at a predetermined gap on both sides of the code pattern of the rotary pulse scale.

According to the first aspect of the present invention described above, since the housing of the photointerruptor for use in the optical transmission-type rotary encoder comprises the housing main body and a pair of optical fiber opposing members each for previously inserting the top end of each of the optical fibers, the end faces of the respective optical fibers can be polished at first upon assembling the photointerruptor, such that the top ends of the light-emitting optical fiber and the light-receiving optical fiber are inserted into the optical fiber opposing members respectively.

Accordingly, the end faces of the optical fibers can be polished easily and effectively by using an abrasive-coated paper or cloth while observing the state of the end faces, which can shorten the time required for the polishing operation, to thereby reduce the production cost.

In addition, since the housing main body has fitting portions formed therein for retaining each of the optical fiber opposing members such that the end faces of the respective optical fibers are opposed to each other at a predetermined distance on both sides of the code pattern of the rotary pulse scale, the photointerruptor can be assembled after the completion of the polishing by merely fitting the optical fiber opposing members into their respective fitting portions of the housing main body.

In this assembling operation, since it is only necessary to fix the optical fiber opposing members to the housing main body and the photointerrupter can be set-up without touching the end faces of the optical fibers after the polishing, there is no worry for injuring or contaminating the end faces of the optical fibers upon mounting the optical fiber opposing members to the housing.

In addition, also in a case of using optical fibers whose end faces are previously polished, since the state of the end faces can be observed easily in the state of inserting the optical fibers into the optical fiber opposing members, it can be confirmed whether the end faces of the optical fibers are injured or contaminated during mounting operation.

Then, if injury or the like is found the end faces can be polished again before assembling and it is possible to provide photointerruptors always at a high quality.

In another aspect of a photointerrupter according to the present invention, the housing is composed of a pair of optical fiber opposing members each for previously inserting the top end of each of the light-emitting optical fiber and the light-receiving optical fiber, and each of the optical fiber opposing members has a connection portion formed therein for connecting the opposing members to each other while positioning the end faces of the optical fibers with their end faces being opposed to each other with a predetermined gap, on both sides of the code pattern of the rotary pulse scale.

In this second feature of the photointerruptor according to the present invention, since the housing of the photointerrupter of the optical transmission-type rotary encoder is composed of a pair of optical fiber opposing members each for inserting the top end of each of the light emitting optical fiber and the light receiving optical fiber, and a pair of optical fiber opposing members are connected with the end faces of the optical fibers being opposed to each other at a predetermined distance on both sides of the code pattern in the rotary pulse scale, easy and satisfactory polishing can be applied while observing the state of the end faces, which can also shorten the time required for the polishing operation in the same way described for the first feature.

In addition, since the housing of the photointerruptor per se is composed of a pair of optical fiber opposing members, the number of parts can be decreased and the photointerruptor can be assembled by merely connecting each of the optical fiber opposing members, it is possible to shorten the assembling time and further reduce the production cost.

BRIEF DESCRIPTION OF THE DRAWINGS

These and other objects, as well as advantageous features of the present invention will become apparent by reading the explanations provided hereinbelow, of the preferred embodiments of the present invention in conjunction with the accompanying drawings, wherein.

DESCRIPTION OF THE PREFERRED EMBODIMENTS

The present invention will now be described by way of its preferred embodiments with reference to the accompanying drawings.

Figure 1:
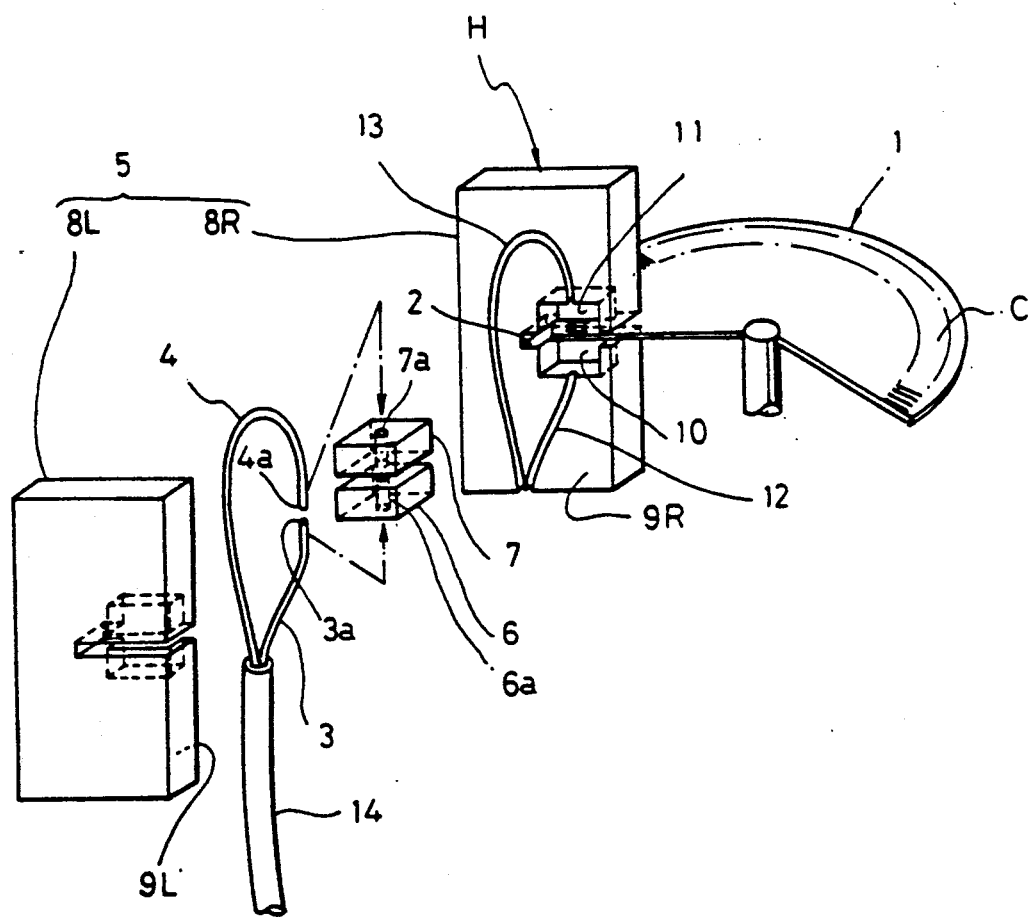
FIG. 1 is an exploded perspective view of a photointerruptor used in an optical transmission-type rotary encoder according to the present invention.
Figure 2:
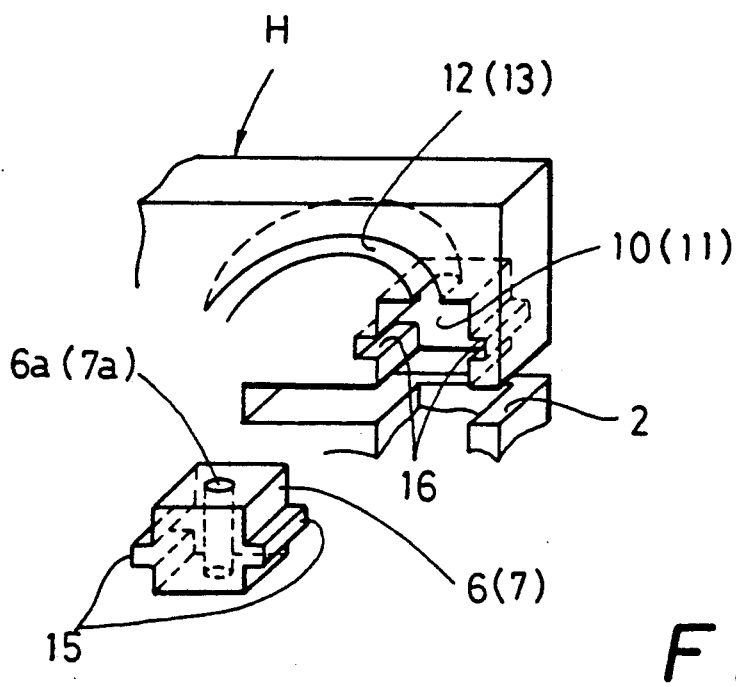
FIGS. 2 and 3 are perspective views illustrating other embodiments.
Figure 3:
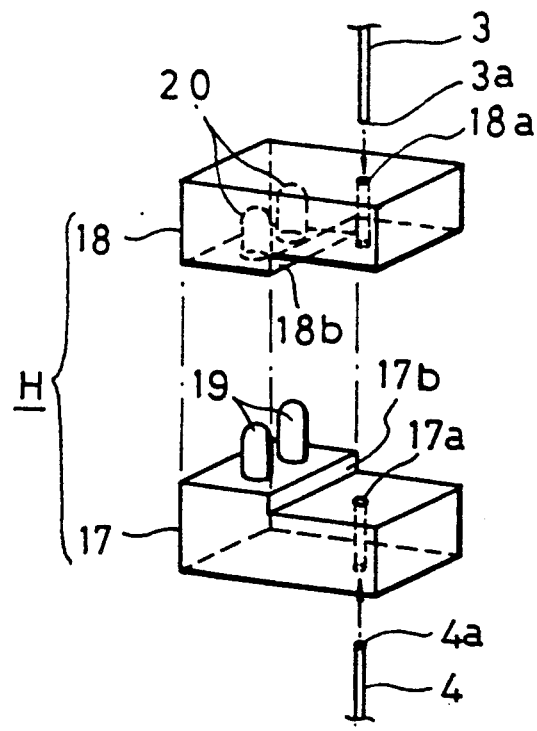

FIG. 1 is an exploded perspective view illustrating a preferred embodiment of a photointerruptor for use in an optical transmission-type rotary encoder according to the present invention, and FIGS. 2 and 3 are perspective views illustrating other embodiments.

Figure 4:
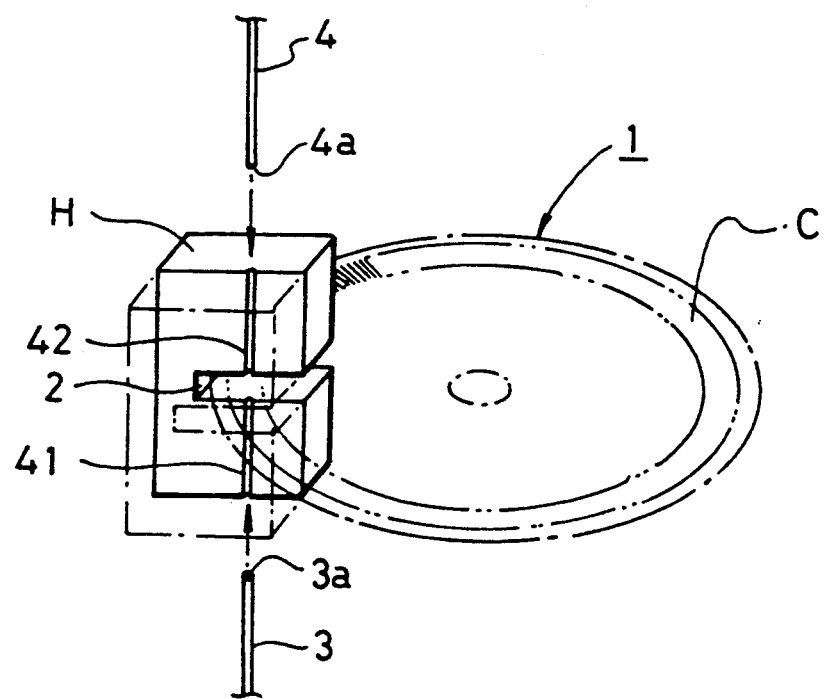
FIG. 4 is a perspective view illustrating a photointerruptor for use in a conventional optical transmission-type rotary encoder.

Portions and components identical with those in FIG. 4 carry the same reference numerals and detailed descriptions of those portions and components are omitted.

A housing H for a photointerrupter comprises a housing main body 5 having a pulse scale-passing groove 2 formed therein and a pair of optical fiber opposing members 6 and 7 adapted for previously inserting the top ends 3a and 4b for a light-emitting optical fibers 3 and a light-receiving optical fiber 4 respectively.

Each of the optical fiber opposing members 6 and 7 is, for example, made of an epoxy resin or like other material and shaped into a rectangular block form. Each of insertion apertures 6a and 7a for inserting and fixing the light-emitting optical fiber 3 and the light-receiving optical fiber 4 is apertured through the center for each of the members 6 and 7, and the top end of each of the optical fibers 3 and 4 is inserted and fixed by bonding to the aperture so that the end faces 3a and 4a of the optical fibers 3 and 4 can be polished while being fixed.

Each of the optical fiber opposing members 6 and 7 is retained in a fitting portion formed in the housing main body 5 and the end faces 3a and 4a of the optical fibers 3 and 4 are disposed such that they are opposed to each other at a predetermined distance on both sides of a code pattern C formed in a pulse scale 1.

The housing main body 5 comprises a right half member 8R and a left half member 8L for putting to hold the optical fiber opposing members 6 and 7 and the optical fibers 3 and 4 from both light and left sides. Fitting portions 10 and 11 for fitting the optical fiber opposing members 6 and 7 respectively are formed to the joining faces 9R and 9L of the right half member 8R and the left half member 8L.

The fitting portions 10 and 11 are formed in symmetry with each other on both sides of the pulse scale-passing groove 2 such that they fit the optical fiber opposing members 6 and 7 so that the end faces 3a and 4a of the optical fibers 3 and 4 are positioned in place being opposed to each other.

Further, the joining face 9R of the right half member 8R has guide grooves 12 and 13 recessed therein for wiring the light-emitting optical fiber 3 and the light-receiving optical fiber 4 inserted through the optical fiber opposing members 6 and 7 so that the light-receiving optical fiber 4 is bent along the guide groove 13 and led out in the same direction as that for the light-emitting optical fiber 3.

Description will now be made of the assembling operation of this embodiment.

At first, each of the light-emitting optical fiber 3 and the light-receiving optical fiber 4 is exposed by a predetermined length from an optical fiber cable 14, and the top ends of the fibers 3 and 4 are inserted into the insertion apertures 6a and 7a of the optical fiber opposing members 6 and 7 respectively and fixed by adhesion with the end face 3a and 4a of the optical fibers being slightly protruded from or flush with the inner surfaces of the opposing members 6 and 7.

In this state, the end faces 3a and 4a of the optical fibers 3 and 4 can be polished individually by using an abrasive-coated paper or cloth while gripping or fixing each of the optical fiber opposing members 6 and 7.

In this case, since the end faces can be polished sufficiently while observing the state of polishing, it is possible to improve the quality of the photointerruptor and, thus, the optical transmission-type rotary encoder using the photointerruptor, as well as it is possible to shorten the time and reduce the labor required for the polishing operation to decrease the production cost.

Then, after completely polishing the end face of each of the optical fibers 3 and 4, the optical fiber opposing members 6 and 7 are fit and secured by means of adhesives respectively to the fitting portions 10 and 11 formed in the right half member 8R of the housing main body 5, and the optical fibers 3 and 4 are fit and secured by means of adhesives into the guide grooves 12 and 13 respectively. Finally, the left half member 8L is covered and bonded to complete the assembling operation for the photointerruptor.

In this step, since the optical fibers 3 and 4 are secured by means of the optical fiber opposing member 6 and 7 respectively to the housing H and the photointerruptor can be assembled without touching the end faces 3a and 4a of the optical fibers 3 and 4, the end faces 3a and 4a of the optical fibers are free from injury or pollution after polishing.

In addition, since the optical fibers 3 and 4 are positioned respectively to attain automatic alignment of the optical axes by fitting each of the optical fiber opposing members 6 and 7 into the fitting portions 10 and 11 respectively, there is no requirement for conducting additional alignment for the optical axes.

Further, each of the optical fibers 3 and 4 can be extended simply in one direction by fitting the optical fiber opposing members 6 and 7 into the fitting portions 10 and 11 and, thereafter, fitting and wiring each of the optical fibers 3 and 4 into each of the guide grooves 12 and 13.

That is, for wiring the two optical fibers in one identical direction, it has been necessary in the prior art to turn one of the optical fibers, which are led out in the opposite directions on both sides of the pulse scale 1, to the identical wiring direction with that of the other optical fiber and, further, to apply a resin molding thereover to constitute a housing. However, according to this embodiment, there is no requirement for such resin molding and the number of porduction steps for the photointerruptor can be reduced, to thereby remarkably decrease the production cost.

As has been described above, since the assembling of the photointerruptor can be completed by merely mounting each of the optical fiber opposing members 6 and 7 after the completion of the polishing, wiring each of the light-emitting optical fiber 3 and the light-receiving optical fiber 4 and bonding to secure both of the half members 8R and 8L of the housing main body 5, the assembling operation is simplified and the assembling time can be shortened, to thereby reduce the production cost.

The configuration for each of the optical opposing members 6 and 7 is not restricted to such a rectangular block form as shown in this embodiment, but it may be in any other form, such as a cylindrical shape. In this case, the shape for the fitting portions 10 and 11 is also formed corresponding to the shape for each of the optical fiber opposing members 6 and 7.

Further, as shown in FIG. 2, a positioning ridge 15 may be formed on each of the sides of the optical fiber opposing member 6 (7). In this case, the end faces 3a and 4a of the optical fibers can be positioned effectively by forming the size of a groove 16 fitting with the ridge 15 in each of the fitting portions 10 and 11 at a high accuracy and accurately setting the size of the fitting portions 10 11 in the direction of the depth and.

The optical fiber opposing member 6 and 7 are secured to the fitting portions 10 and 11 by means of adhesives in this embodiment. However, any other securing means can be employed in the present invention. For instance, each of the half members 8R and 8L of the housing main body 5 may be clamped strongly from both sides thereof by screw fixing, or the optical fiber opposing members 6 and 7 may be clamped directly by using screw fixing from the outside of the housing main body 5 at positions other than those in which the optical fibers 3 and 4 are not present.

FIG. 3 is a perspective view illustrating another embodiment of the present invention, in which the housing H itself is composed of two optical fiber opposing members 17 and 18 each for inserting the top ends of each of a light-emitting optical fiber 3 and a light-receiving optical fiber 4.

The optical fiber opposing members 17 and 18 have insertion apertures 17a and 18a respectively perforated for holding the end faces 3a and 4a of the optical fibers 3 and 4 such that the end faces can be polished. The optical fiber opposing member 17 has protrusions 19, 19, while the other optical fiber opposing member 18 has fitting sockets holes 20, 20 so that both of the members 17 and 18 are connected to each other, with the end faces 3a and 4a of the optical fibers 3 and 4 being opposed to each other with a predetermined distance between them.

Further, the opposing members 17 and 18 have steps 17b and 18b respectively formed to their opposing surfaces for constituting a pulse scale-passing groove 2 when they are combined with each other.

Accordingly, in this embodiment, the optical fibers 3 and 4 can be inserted and secured individually into the optical fiber opposing members 17 and 18, respectively, and the end faces 3a and 4a of the respective optical fibers 3 and 4 can be polished. Then, after the completion of the polishing, the photointerruptor can be assembled by merely connecting the fitting protrusions 19 of the optical fiber opposing member 17 with the respective fitting holes 20 formed in the optical fiber opposing member 18.

In this way, since the housing H is constituted only with two optical fiber opposing members 17 and 18, the number of parts can be reduced to decrease the cost.

In addition, since the fitting protrusions 19 and fitting holes 20 are each formed in pairs, the respective optical fibers can be positioned accurately by merely connecting the optical fiber opposing members, by which the assembling operation can be facilitated and the assembling time can be shortened.

Furthermore, any optional means can be adopted for connecting the optical fiber opposing members 17 and 18, since such means are not restricted to the fitting protrusions 19 and the fitting holes 20 as are preferably used in this embodiment.

As has been described above according to the present invention, since optical fiber opposing members are adapted for previously inserting the top ends of the light-emitting optical fiber and the light-receiving optical fiber, the end face can be applied with sufficient polishing by using an abrasive-coated paper or cloth while observing the state of the end face, thereby enabling to provide an excellent effect capable of reducing the time required for the polishing operation and reducing the production cost.

In addition, since the photointerruptor can be assembled without touching the end faces of the optical fibers by polishing the optical fibers at their end faces and then attaching the optical fibers by way of the optical fiber opposing members to the housing, or by connecting the optical fiber opposing members to each other, it can provide an advantageous effect, permitting assembly with neither injury nor pollution of the end faces.

What is claimed is:

1. A photointerrupter for use in an optical transmission-type rotary encoder in which a pulse scale having a code pattern formed therein is arranged to be rotated in a plane, said photointerrupter comprising:
a light-emitting optical fiber having an end portion terminating in an end face;
a light-receiving optical fiber having an end portion terminating in an end face;
a housing having a slot means formed therein for partially enveloping said pulse scale on axially opposite sides of said plane;
a pair of optical fiber opposing members, each having an aperture formed therethrough and opening through a surface thereof;
said end portion of said light-emitting optical fiber being mounted in and extending through the respective said aperture of one of said optical fiber opposing members and having said end face thereof juxtaposed with said surface of said one of said optical fiber opposing members;
said end portion of said light-receiving optical fiber being mounted in and extending through the respective said aperture of the other of said optical fiber opposing members and having said end face thereof juxtaposed with said surface of said other of said optical fiber opposing members; and
means mounting said optical fiber opposing members to said housing with said end faces of said light-emitting optical fiber and said light-receiving optical fiber spacedly confronting one another, with a gap of predetermined axial extent between them, on axially opposite sides of said plane, axially across said slot means, so that, in use, light emitted from said end face of said light-emitting optical fiber must penetrate through said pulse scale at said plane in order to be received through said end portion of said light-receiving optical fiber.

2. The photointerrupter of claim 1, wherein:
said housing includes means defining two recesses, respectively contiguous with and opening through opposite sides of said slot means;
said housing includes a main body having two guide grooves recessed therein, said guide grooves extending parallel to one another in a first portion, then diverging, with one said guide groove terminating by intersection with one of said recesses, and the other said guide groove curving around in said main body and terminating by intersection with the other of said recesses;
said mounting means comprising means mounting said optical fiber opposing members in respective ones of said recesses; and
said light-emitting optical fiber and said light-receiving optical fiber, adjacant and leading to said end portions thereof, being received in respective ones of said guide grooves.

3. The photointerrupter of claim 1, wherein:
said housing comprises a main body right portion and a main body left portion, said lift portion and right portion being separable from one another, and assembled together for constituting said main body;
said housing includes means defining two recesses, respectively contiguous with and opening through opposite sides of said slot means, each said recess being formed partly in said right portion and partly in said left portion of said main body of said housing;
said mounting means comprises means mounting said optical fiber opposing members in respective ones of said recesses cooperatively in both of said portions of said main body of said housing.

4. The photointerrupter of claim 3, wherein:
said mounting means includes ridges on said optical fiber opposing members, received in corresponding grooves formed in said left and right portions of said main body of said housing and opening into respective ones of said recesses.

5. The photointerrupter of claim 3, wherein:
said optical fiber opposing members each further respectively include two different types of connection members, which are cooperatively engaged with one another for maintaining said optical fiber opposing members in a predetermined spatial relationship relative to one another.

6. The photointerrupter of claim 1, wherein:
said optical fiber opposing members each further respectively includes two different types of connection members, which are cooperatively engaged with one another for maintaining said optical fiber opposing members in a predetermined spatial relationship relative to one another.

* * * * *